(12) United States Patent  
Steinmeier et al.

(10) Patent No.: US 7,263,418 B2  
(45) Date of Patent: *Aug. 28, 2007

(54) METHOD AND DEVICE FOR VISUALIZING A VEHICLE REPAIRING

(75) Inventors: Eckhard Steinmeier, Munich (DE); Ralf Rachholz, Munich (DE); Birsen Goek, Munich (DE); Martin Kulessa, Munich (DE); Bernhard Hoess, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/201,112

(22) Filed: Aug. 11, 2005

(65) Prior Publication Data

US 2005/0273229 A1 Dec. 8, 2005

Related U.S. Application Data

(63) Continuation of application No. PCT/EP04/01710, filed on Feb. 20, 2004.

(30) Foreign Application Priority Data

Feb. 24, 2003 (DE) ................................ 103 07 980  
Feb. 24, 2003 (DE) ................................ 103 07 981

(51) Int. Cl.  
*G01M 17/00* (2006.01)

(52) U.S. Cl. ......................... 701/29; 701/31; 701/33; 700/23; 700/26

(58) Field of Classification Search .................. 701/29, 701/31–34; 700/95–98, 103, 108–110, 28, 700/11, 17, 23, 26; 702/33, 35–36, 150–153; 705/1, 29

See application file for complete search history.

(56) References Cited

U.S. PATENT DOCUMENTS 5,774,361 A * 6/1998 Colarelli et al. .............. 701/29

(Continued)

FOREIGN PATENT DOCUMENTS

DE 199 59 617 A1 6/2001

(Continued)

OTHER PUBLICATIONS

Lattice3D: "Manuals with Complete 3D Visualization—Faster, Better, More Accurate." Internet, 'Online!, Mar. 11, 2003, XP002285845; URL: www.latice3d.com/L3D_DS-05_Manual_110303a.pdf> 'gefunden am 204-06-24!.

(Continued)

*Primary Examiner*—Gertrude A. Jeanglaude  
(74) *Attorney, Agent, or Firm*—Crowell & Moring LLP

(57) ABSTRACT

A method is provided for providing image data for visualizing a defective part and/or a repair process and/or a maintenance service of a road-bound vehicle, in particular a car or motorcycle. The aim is to reduce the translation costs for repair manuals. The method is characterized by the following: digital data is provided for at least two vehicle parts, in particular CAD data, vector data or another form of digital data suitable for visualizing is provided; digital data on the location of said two vehicle parts with respect to each other is also provided; a first selection element is provided for selecting a first repair operation from a plurality thereof, data, i.e., image data of the first stage of said first repair operation is provided, afterwards image data of the second stage of the first repair operation is provided.

11 Claims, 2 Drawing Sheets

U.S. PATENT DOCUMENTS

| | | | |
|---|---|---|---|
| 5,777,597 A * | 7/1998 | Tani et al. | 715/845 |
| 5,867,273 A * | 2/1999 | Corby, Jr. | 356/613 |
| 6,138,056 A | 10/2000 | Hardesty et al. | |
| 6,701,615 B2 * | 3/2004 | Harding et al. | 29/889.1 |
| 6,826,500 B2 * | 11/2004 | Linthicum et al. | 702/98 |
| 2002/0059270 A1 * | 5/2002 | Schlabach et al. | 707/100 |
| 2002/0161533 A1 * | 10/2002 | Uegaki | 702/35 |
| 2002/0198639 A1 | 12/2002 | Ellis et al. | |
| 2003/0097195 A1 * | 5/2003 | Yamrom et al. | 700/95 |
| 2004/0148188 A1 * | 7/2004 | Uegaki | 705/1 |

FOREIGN PATENT DOCUMENTS

| | | |
|---|---|---|
| DE | 199 53 739 C2 | 10/2001 |
| EP | 0 967 456 A2 | 12/1999 |
| EP | 1 065 603 A2 | 1/2001 |
| GB | 2 327 289 A | 1/1999 |
| WO | WO 00/52537 | 3/2000 |

OTHER PUBLICATIONS

Lattice3D: "Maintenance Manual Item Demo" Internet, Online! XP002285846, URL: www.lattice3d.com/3ddemo/MaintenanceManual/video/MaintenanceManual2.html>.

R.S. Blue et al., "An automated approach and virtual environment for generating maintenance instructions" Conference On Human Factors in Computing Systems—Demonstration Session, Apr. 20, 2002, XP002285847, Minneapolis, Minnesota, USA ISBN: 1-58113-454-1.

* cited by examiner

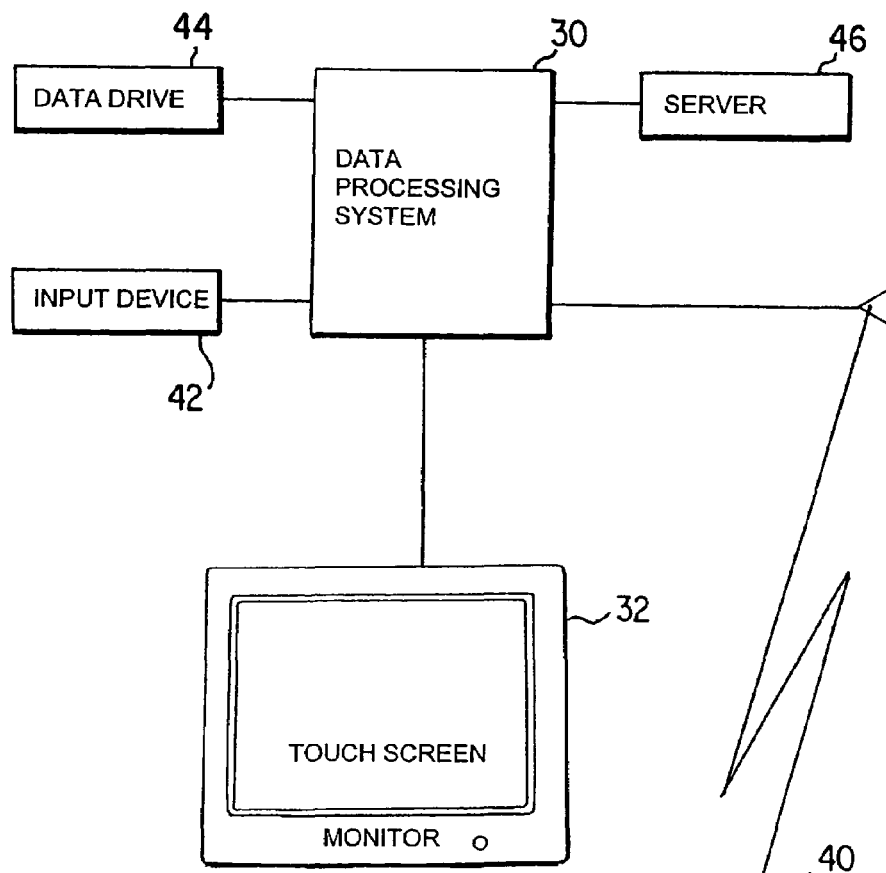
Fig. 2
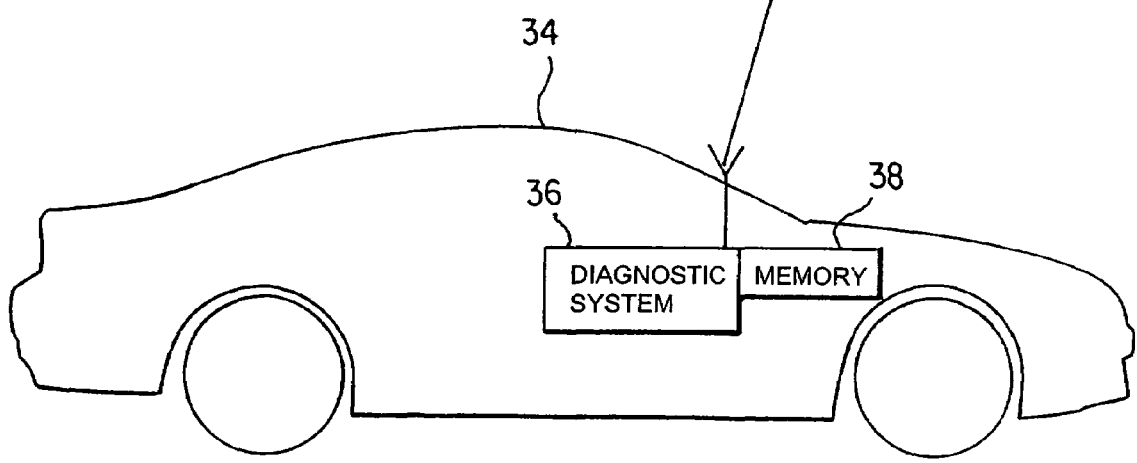

METHOD AND DEVICE FOR VISUALIZING A VEHICLE REPAIRING

CROSS-REFERENCE TO RELATED APPLICATIONS

This application is a continuation of PCT Application No. PCT/EP2004/001710 filed on Feb. 20, 2004, which claims priority to German Application Nos. 103 07 981.5 filed Feb. 24, 2003 and 103 07 980.7 filed Feb. 24, 2003.

The invention relates to a method of providing image data for visualizing a defective part and/or a repair sequence and/or a maintenance service sequence of a road-bound vehicle, in particular for a passenger car or a motorcycle.

Known repair instructions normally consist of a text and two-dimensional graphics or drawings. The texts of such repair instructions are translated, at high expenditure and therefore high cost, into the languages of the corresponding countries.

It is an object of the invention to reduce the translation costs.

A significant aspect of the method according to the invention is the following approach. The first step is to provide digitized data, particularly CAD or vector data (or another data format), which can be visualized, of at least two components of the vehicle. These data or the output data, according to the invention, are preferably the vehicle construction data, which exists anyhow and which represents the vehicle in a display in the virtual space. These data preferably are CATIA or Pro-E data with which a person skilled in the art is familiar. The data can be provided, for example, on a DVD, CD-ROM or in a databank accessible online.

In a second step, the digitized data of the arrangement of the two components of the vehicle are provided relative to one another.

In a third step, the digitized data of at least one fastening device, which connects the two components of the vehicle with one another, are preferably provided.

In a fourth step, a first selection element is provided for the selection of a first repair sequence from a plurality of repair sequences for the selection by a user of the method. In a fifth step, the providing of the image data of the first step of the first repair sequence takes place, which is followed by the providing of the image data of the second step of repair sequence, etc. The plurality of the repair sequences preferably are individual sequences of the (entire) repair process. In one embodiment, the sequences are offered in a chronological order for the selection and reproduction in a display.

In a sixth step, the providing of the image data of at least a first tool for the actual implementation of the first step on the vehicle, and the providing of the image data of at least a second tool for the actual implementation of the second step on the vehicle, etc., preferably takes place. By displaying the tools required for the repair, the implementation of a real temperature is facilitated and accelerated.

The method according to the invention permits a largely visual detailed representation of repair sequences, the displaying of the virtual repair largely corresponding to the real repair by a mechanic. Because of the few (or completely absent) text parts in the virtual representation, translation costs are considerably reduced in comparison to the known solution. As a result of the use of CAD, CATIA data, or the like, produced anyhow in constructing the vehicle or in connection with the simulation of production or assembly processes, the method according to the invention can be implemented economically.

Other objects, advantages and novel features of the present invention will become apparent from the following detailed description of the invention when considered in conjunction with the accompanying drawings.

BRIEF DESCRIPTION OF THE DRAWINGS

FIG. 2 is a block diagram illustrating the device for performing the method according to the present invention.

DETAILED DESCRIPTION OF THE DRAWINGS

Figure 1:
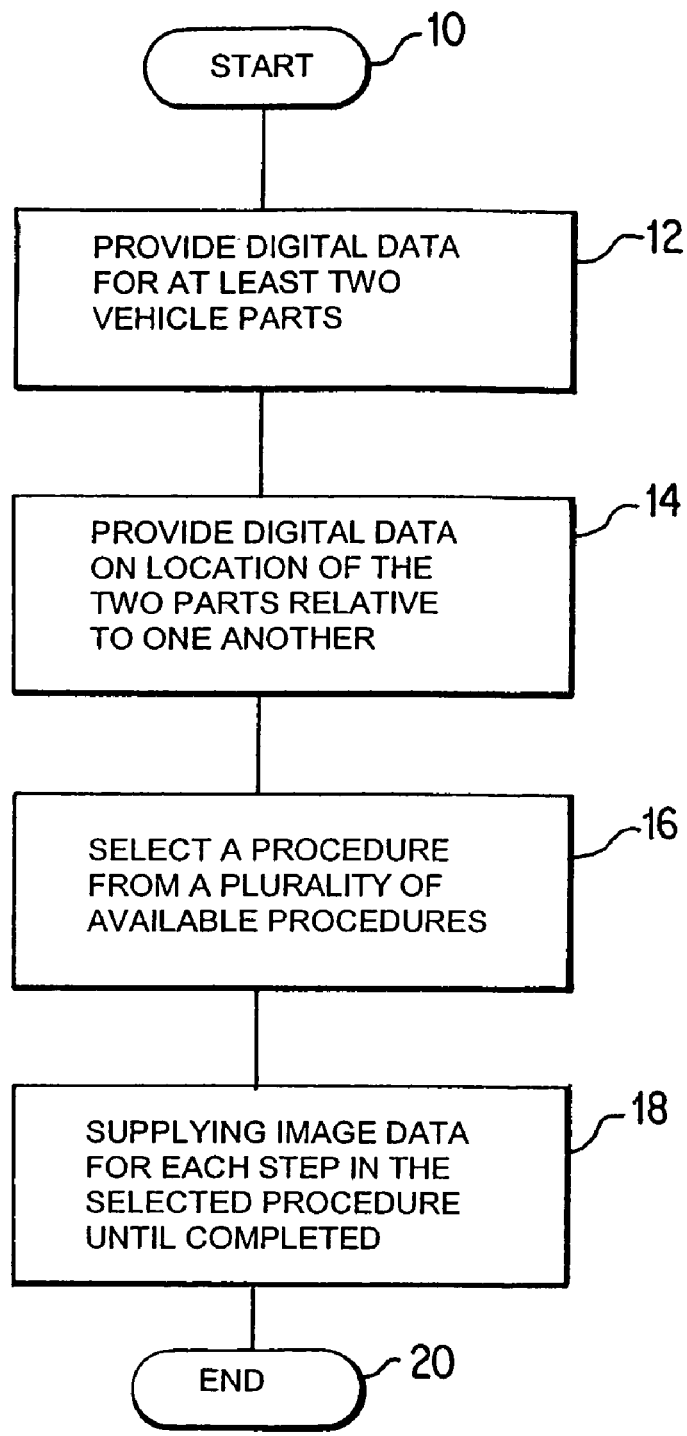
FIG. 1 is a flow chart illustrating a first embodiment of the method according to the present invention.

Referring to FIG. 1, there is shown a flow chart of an embodiment of the method according to the present invention. The method is characterized by the following. After beginning (step 10), digital data is provided for at least two vehicle parts (step 12), the digital data being, in particular, CAD data, vector data, or any other form of digital data suitable to be visualized. Then, digital data is provided on the location of the two vehicle parts with respect to each other (step 14). The user then selects a procedure from a plurality of available procedures (step 16), such as a repair or a maintenance service procedure. Upon selecting the procedure, image data is supplied for each step in the selected procedure until the procedure is completed (step 18). For example, the image data of the first stage of a first repair operation is provided, and afterwards image data of the second stage of the first repair operation is provided, and so on.

Referring to FIG. 2, for example, in an embodiment of the invention, the use of a data processing system 30 with a manual data input device, particularly a touch-sensitive monitor 32, that is, a so-called touch screen monitor 32, is provided for displaying the provided image data and the first selection element, the first selection element optionally being selected by manual touch. Such a data processing system 30 or such a repair display device is compact and not susceptible to disturbances even under rough everyday repair shop conditions.

In a further development of the invention, the diagnostic system 36 of the vehicle to be repaired or serviced is included in the method according to the invention. The diagnostic system of the vehicle normally has at least one fault memory 38 for detecting the condition, or the operational readiness, of at least a first electronic component of the vehicle. According to the invention, it is provided to connect the diagnostic system by way of the diagnostic plug of the vehicle and/or in a wireless manner 40 by way of a corresponding transmitting/receiving device with the data processing system. The fault and/or condition data transmitted to the data processing system by the diagnostic system are analyzed by the data processing system. As a function of the concrete fault or condition data, which preferably show also the concrete vehicle type and/or the concrete vehicle equipment, one or more vehicle-type-specific repair sequences are provided for the movie-like representation in the display 32 of the data processing system. For implementing the process, the data processing system according to the invention has a corresponding sequence control, preferably completely or partially in a software-controlled fashion.

In a further development of the method according to the invention, defective components of the vehicle are highlighted in a display and a visual repair or maintenance servicing instruction is provided. This permits a fast implementation of a repair or servicing and also reduces the fault rate. It is a prerequisite that the function of the component or the fluid levels of the components to be serviced is or are monitored by the diagnostic system. The components may, for example, be electrical components, such as control units, relays or switches, as well as electrically monitored components, such as the brake pads. Examples of visually supported maintenance service work are the adding of engine and transmission fluids, brake fluid, etc., and the exchanging of brake pads or other parts subjected to wear.

In the case of the method according to the invention, information is preferably provided with respect to the necessity of the exchange of a visually correspondingly marked part or component, and (visual) information is supplied concerning a successfully implemented exchange; for example, in that the electrical function of the exchanged component is recognized by the diagnostic device of the vehicle and is transmitted to the data processing system according to the invention and is displayed by the latter. The same applies to a servicing job or a fluid level of the vehicle, in that the data processing system displays a fluid level which is too low—with the participation of the diagnostic system of the vehicle—and, during or after the adding of fluid, also displays the actual fluid level or a correctly implemented servicing job.

In another embodiment of the method, it is provided that at least the relevant defective component or the component to be serviced, such as a fluid tank or the brake pads, is visually highlighted in comparison to other components, for which, preferably, a detailed representation and/or a representation with a larger resolution and/or an enlarged representation is displayed by the data processing system.

In an alternative or supplementary embodiment of the invention, the data processing system provides a manually operable selection element 42 for changing the viewing angle onto the repair scene. This provides the mechanic with the virtual possibility of looking at the repair or servicing sequence from different viewing angles and of resolving unclear situations. This measure according to the invention increases the quality as well as the speed of the repair or servicing.

In another alternative or supplementary embodiment of the invention, it is provided that the software-controlled data processing system provides a manually operable selection element 42 for the complete or partial masking-out of at least one of the components illustrated in the repair sequence for the display. This measure also aids the clarification of the repair or servicing sequence in the virtual mode of representation and leads to better quality and a higher speed of the real sequence.

In a particularly preferred embodiment of the invention, the process is carried out by a software-controlled data processing system, which is equipped with a display and a wireless receiving device for receiving the fault and/or condition data of the diagnostic system of the motor vehicle. The wireless uni- or bidirectional communication between the data processing system and the diagnostic system of the vehicle can take place, for example, by way of a connection on the basis of the Bluetooth standard if the vehicle is equipped correspondingly. Likewise, a so-called wireless LAN connection can be established in that the interface of the diagnostic system to the "outside world" is equipped with a corresponding LAN device or is temporarily equipped therewith in the repair shop.

In another, particularly preferred embodiment of the invention, the process according to the invention is carried out using a touch-sensitive display, i.e., a so-called touch screen. On this touch screen, as a result of touching corresponding selection elements, particularly the type of representation of the repair or service sequence to be carried out can be influenced in the form of a video animation. This applies particularly with regard to the illustrated viewing angle and/or to the complete or partial masking-out of interfering components.

As a rule, the operational sequences are vehicle-specific; that is, they change from one vehicle type to another. It is therefore necessary that the digitized data of the components, etc. of the corresponding vehicle type are always available to the data processing system. In order to achieve this, it is provided in one embodiment of the invention that the data processing system determines the vehicle type by means of characteristic data, which the diagnostic system transmits to the data processing system. The data processing system then prompts the insertion of a specified data carrier which as the data, such as a DVD, in a corresponding drive 44.

As an alternative or in addition, it is provided in the case of another embodiment of the invention that the data processing system retrieves the relevant data from a server 46 which stores the data for a plurality of vehicle types—in an up-to-date form.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of providing image data for visualizing at least one of a defective part, a repair sequence, and a maintenance service sequence of a road-bound vehicle, the method comprising the acts of:
    providing digitized data of at least two components of the vehicle, said digitized data being capable of being visualized;
    providing digitized data of an arrangement of the at least two components of the vehicle relative to one another, said digitized data being capable of being visualized;
    operating a first selection element for selecting a first procedural sequence from a plurality of procedural sequences; and
    based on the operating act, providing image data of a first step of the first procedural sequence and, subsequently, providing image data of a second step of the first procedural sequence,
    wherein the first procedural sequence includes at least one repair sequence, which includes:
        illustrating on a display the removal of a defective first electronic component;
        detecting a correct installation of a new first electronic component via the vehicle's diagnostic system;
        transmitting the detection of the correct installation of a new first electronic component to a data processing system; and
        displaying the correct installation by checking the operation of the new first electronic component by the diagnostic system and transmitting the information to the data processing system.

2. The method according to claim 1, wherein said digitized data is CAD or vector data.

3. The method according to claim 2, wherein said road-bound vehicle is a car or a motorcycle.

4. The method according to claim 1, further comprising the acts of:
- detecting a condition or operational readiness of at least a first electronic component of the vehicle using a vehicle's diagnostic system;
- communicating the condition for operational readiness from the diagnostic system to the data processing system via a hard-wired or wireless connection; and
- processing fault and condition data, provided by the diagnostic system, in the data processing system and, as a function of the fault or condition data, providing at least a first repair sequence for display.

5. The method according to claim 4, wherein the fault or condition data provided by the diagnostic system indicates a particular vehicle type involved, and further wherein the first repair sequence for the particular vehicle type involved is provided for display.

6. The method according to claim 1, wherein during the act of providing the image data, the method further comprises the act of highlighting at least one of the at least two components in a visible manner in contrast to at least one other of the at least two components.

7. The method according to claim 6, wherein the act of highlighting is performed by providing at least one a detailed representation of the at least one component, a representation having a larger resolution of the at least one component, and an enlarged representation displayed to the user.

8. The method according to claim 1, further comprising the acts of:
- displaying image data of at least a first tool for implementation of the first step, and
- displaying image data of at least a second tool for implementation of the second step.

9. The method according to claim 1, wherein the image data and the first selection element are represented on a touch-sensitive monitor operably configured with the data processing system, and the first selection element is selected by a user manually touching the touch-sensitive monitor.

10. The method according to claim 1, wherein the data processing system includes a manually operable selection element for changing a viewing angle onto the at least two components shown in the first procedure sequence for display.

11. The method according to claim 1, wherein the data processing system includes a manually operable selection element for a complete or partial masking-out of at least one of the at least two components shown in the first procedure for display.

* * * * *